United States Patent [19]

Quinn et al.

[11] Patent Number: 4,722,060

[45] Date of Patent: Jan. 26, 1988

[54] INTEGRATED-CIRCUIT LEADFRAME ADAPTED FOR A SIMULTANEOUS BONDING OPERATION

[75] Inventors: Daniel J. Quinn; Robert H. Bond, both of Carrollton; Wayne A. Mulholland, Plano; Steven Swendrowski, The Colony; Michael A. Olla, Flower Mound; Jerry S. Cupples; Barbara R. Mozdzen, both of Carrollton; Linda S. Wilson, Pilot Point; Linn Garrison, Garland, all of Tex.

[73] Assignee: Thomson Components-Mostek Corporation, Carrollton, Tex.

[21] Appl. No.: 592,144

[22] Filed: Mar. 22, 1984

[51] Int. Cl.⁴ .................... H01R 9/09; H01L 23/00
[52] U.S. Cl. .................... 364/490; 29/827; 228/180.2; 357/70
[58] Field of Search .......... 364/490; 357/70; 174/52 FP; 29/827, 840; 228/188, 180.1, 180.2; 361/421, 401; 339/17 CF, 252 R, 252 F, 252 D, 252 S, 252 T, 253 A, 253 S, 254 R, 254 M

[56] References Cited

U.S. PATENT DOCUMENTS

| | | | |
|---|---|---|---|
| 3,586,813 | 5/1971 | Cruickshank | 228/180.2 |
| 3,689,684 | 9/1972 | Cox, Jr. et al. | 361/421 |
| 3,708,730 | 1/1973 | Schierz et al. | 357/70 |
| 3,716,761 | 2/1973 | Rotast . | |
| 3,765,590 | 10/1973 | Duffek et al. | 228/180.2 |
| 3,831,131 | 8/1974 | Woodcock et al. | 339/252 R |
| 3,859,723 | 1/1975 | Hamer et al. | 228/180.2 |
| 3,916,513 | 11/1975 | Ballard | 29/827 |
| 3,982,979 | 9/1976 | Hentz et al. | 228/180.2 |
| 4,129,682 | 12/1978 | Stewart et al. | 357/70 |
| 4,155,615 | 5/1979 | Zimmerman, Jr. et al. | 29/827 |
| 4,176,443 | 12/1979 | Iannuzzi et al. | 228/180.2 |
| 4,298,883 | 11/1981 | Komatsu et al. | 357/70 |
| 4,346,952 | 8/1982 | Bright et al. | 339/17 CF |
| 4,355,463 | 10/1982 | Burns | 29/827 |
| 4,470,648 | 9/1984 | Davis et al. | 261/421 |

FOREIGN PATENT DOCUMENTS 0095223 11/1983 Netherlands .

Primary Examiner—Marshall M. Curtis
Attorney, Agent, or Firm—Roland Plottel

[57] ABSTRACT

A leadframe for an integrated circuit includes a set of individual leads temporarily connected in an array; each lead having an exterior portion shaped in a standard form and an interior portion shaped to form a standard array of contacts and to have the same spring constant for deflections perpendicular to the plane of the leadframe.

5 Claims, 18 Drawing Figures

QUADRANT 20
28 PLACES

INTEGRATED-CIRCUIT LEADFRAME ADAPTED FOR A SIMULTANEOUS BONDING OPERATION

TECHNICAL FIELD

The field of the invention is that of attaching leads to integrated circuit chips.

BACKGROUND ART

The assembly operation for integrated circuits, sometimes referred to as the "back-end", consists of taking a silicon wafer containing several hundred or more integrated circuit chips; testing the chips to determine which are working and which are not; cutting the chips apart; attaching the chip to a leadframe; bonding wires to the leads one at a time; and encapsulating the combination in plastic to provide protection for the device and cutting and bonding the external parts of the leadframe to their final shape.

The standard method of attaching wires to the chip is by wire bonding, in which a gold or aluminum alloy wire is pressed very hard (in the presence of elevated temperatures and/or ultronsonic energy) against a pad on the chip until a bond is formed. One wire is done at a time. This method uses a great deal of labor and expensive materials. Automated wire bonding machines are known, but they have an inherent limitation. Even with the most rapid machines that can be imagined, there are factors that provide a necessary limitation to approximately 2,000 units per hour for a 16 pin chip. With wire bonding techniques, it is also necessary to attach the chip to the package or leadframe in order to maintain it in position while the wire bonds are formed. Also, the leads in this process must be made of an expensive expansion-controlled alloy in order to have the correct thermal expansion matching between the chip and the leads or expensive special adhesives must be used to correct the thermal mismatch. Also, the leads must be plated with gold, silver or other precious metal so that the bending wire can form a reliable connection to the lead.

One prior art method that provides for simultaneous lead soldering is the "flip-chip" method developed by IBM, in which a lump of solder is placed on the chip and the chip is soldered to a ceramic substrate that is attached to the leads. This IBM method does not have a layer of leads on the top of the chip.

DISCLOSURE OF INVENTION

The invention relates to a leadframe adapted for an automated method of assembling and encapsulating integrated circuit chips in which the chips have standard connections that are in the same position for a number of different models of chips; the leads are all attached at the same time (by a soldering method); the leadframe is stamped from an inexpensive metal, such as copper, and the integrated circuit die is not attached to a support in an intermediate step.

A feature of the invention is the provision of a leadframe adapted for reliable formation of bonds simultaneously in an automatic process.

A feature of the invention is the assembly of integrated circuits by a method in which all leads are attached simultaneously, so that the speed of assembly does not depend on the number of pins.

Another feature of the invention is the provision of a standard pad array used for different chips having the same number of pins, so that only one type of leadframe need be kept in inventory for each pin-family.

Yet another feature of the invention is the superior heat dissipation provided by the relatively large leads.

Yet another feature of the invention is the elimination of the need for thermal expansion compatability between the leadframe and the chip.

Yet another feature of the invention is the elimination of an intermediate step of bonding a die to a support before lead attachment.

BEST MODE FOR CARRYING OUT THE INVENTION

The present invention was developed together with other components of a system for assembling and testing integrated circuits. Other features of the system are the subject of co-pending patent applications, filed the same day herewith and assigned to the assignee hereof. In order to convey the invention in context, discussion of the overall system is included in this specification.

Figure 1:
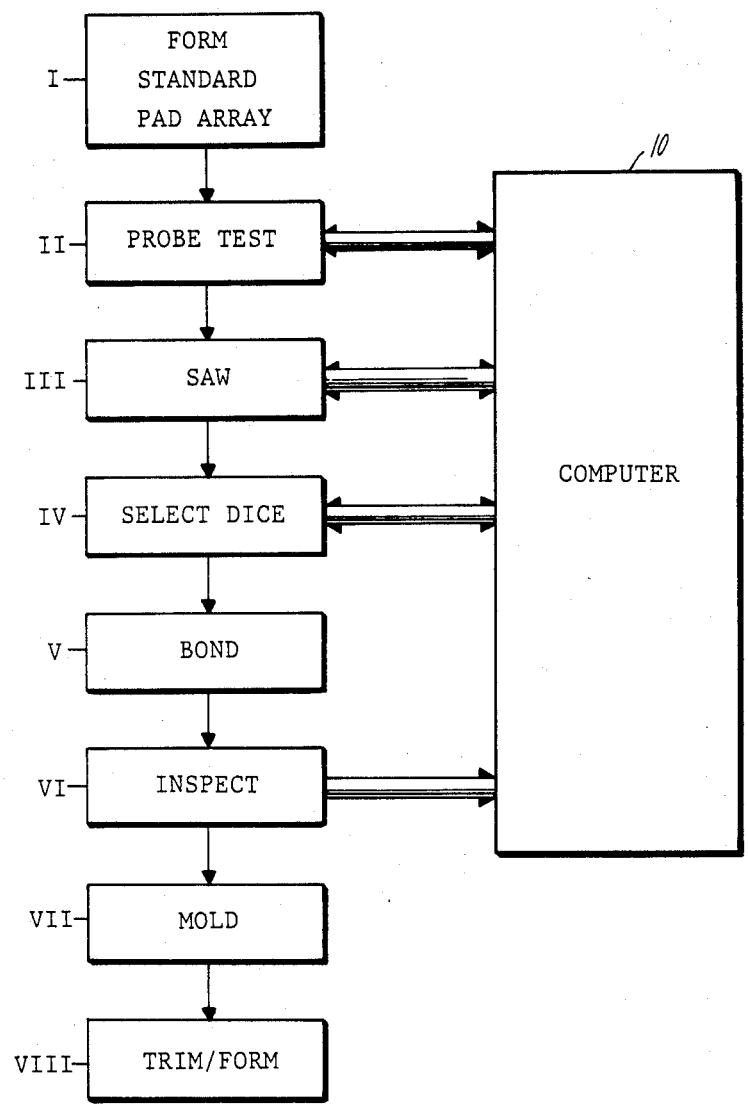
FIG. 1 illustrates the process flow in the subject invention.

An overall flow chart of the steps used in the back-end assembly is illustrated in FIG. 1, in which a number of steps are illustrated schematically and are performed by a variety of different machines in communication with and sometimes controlled by a computer for storing test and other data.

In the first major step, represented by the box labelled I, a process that may be part of the "front-end" or the "back-end", accepts as input a wafer that has been completed with all the conventional steps (including passivation—etc.) and applies a further layer of dielectric having a thickness sufficient to protect the chip circuits and to insulate them electrically from signals being carried on the top surface of the dielectric.

A pattern of metal leads is formed that extends from the contact pads on the previous chip to a standard array of contact pads on the top of the dielectric. The standard array is the same for all chips having the same number of pins, regardless of the size of the chip die.

The wafer is then probe tested, in major step II with the results of the probe test being stored electrically, such as in a computer. The conventional ink-dot marking system for bad chips is not used.

The wafer is then adhesively mounted on an adhesive film in a frame holder that is shaped to allow for automatic insertion and orientation in various fixtures further along in the process and cut apart in an automatic sawing process (Step III) that cuts through the entire thickness of the wafer.

The good dice are then removed from the wafer in an automatic sequence (Step IV) that presses from above against the tape to selectively pick a die down into a dedicated carrier where it rests circuit side down. This is not a problem since the active circuitry is protected by the standard pad dielectric and standard pads. The wafer and punch-out device are moved under computer control to put the dice into the correct positions in the carrier.

The dice are transferred to a mating carrier simultaneously in an inversion operation that rotates the two-carrier "sandwich" by 180 degrees, so that the dice resting in the second carrier have contacts on the top side. A set of dice are transferred to a bonding fixture that holds a convenient number, illustratively 14 dice. Once loading is complete, a leadframe matching the spacing of the dice in the fixture is positioned above the dice in the soldering fixture and an upper bonding fixture is added to maintain lead to pad contact during the bonding process.

The bonding fixture is heated to reflow the solder and form the interconnection (Step V).

The leadframe with dice attached is placed in a transfer or injection molding machine that encapsulates the die together with the interconnections to the leadframe (Step VI).

The molded strip of devices is then trimmed and formed conventionally (Step VII).

There is a representation in FIG. 1 of data communication between the machines that perform the steps listed above and the controlling computer. Most data communication steps are optional. The step may indeed be performed under operator control and data may be written down manually. The benefits of automatic recording of data and error-free recall of data from a previous step will be evident to those skilled in the art.

The different steps of the invention are set forth in more detail below and in copending patent applications filed on the same date herewith and assigned to the assignee hereof.

Figure 2:
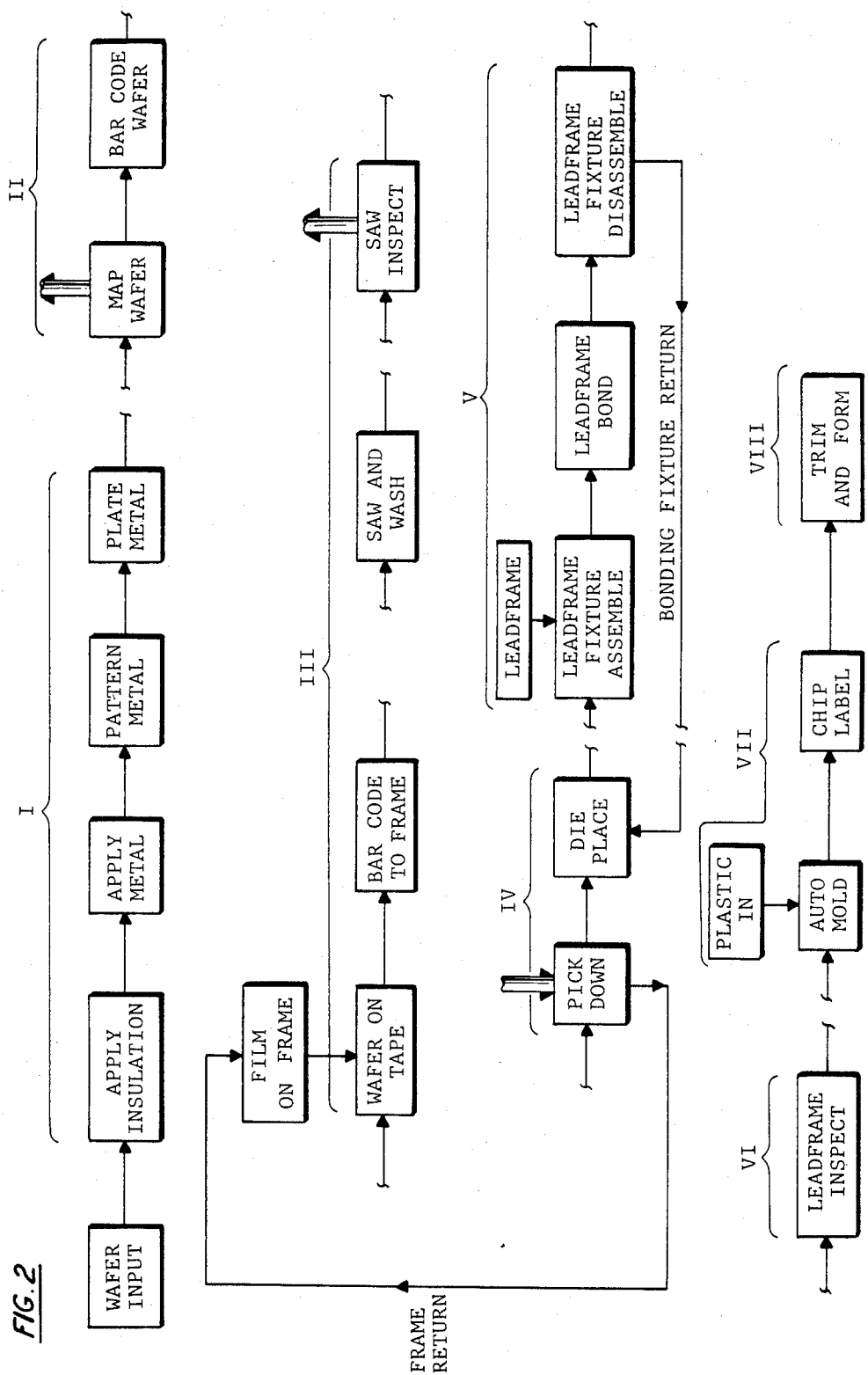
FIG. 2 illustrates the steps in FIG. 1 in more detail.

FIG. 2 sets out the steps in FIG. 1 in more detail and also illustrates the material and data flow. A convention used in this figure is that a broken line indicates a material transport step of the sort of loading the material into a container and moving the container to another location and a double arrow indicates data flow into or out of a computer or other storage device. The three material inputs to the process are the wafers, leadframes and plastic for encapsulation. Two recirculation loops involve, respectively, a frame used to support the wafers during the sawing and die selection steps and a positioning fixture used to maintain a set of dice in alignment with a leadframe segment during the bonding operation.

Standard Contact Pads

Returning to the first major step, the illustrative dielectric layer is a polyimide such as Dupont 2525 applied with the thickness of 6 microns and cured at a temperature of greater than 260 C. There may be a nitride or other layer below the polyimide to improve adhesion to the reflow glass or other top layer. The electrical contact pads that have been previously formed in the integrated circuit chip by conventional processing techniques are exposed by applying a photoresist, either liquid or in the form of a tape, on top of the dielectric and etching down through it a passageway to the metal contact pad in the circuit in a conventional manner. A "via" will be formed by filling the contact holes with a metal or other conductor until the surface of the dielectric is reached. The photoresist is stripped off and a layer of metal is applied by any technique, such as sputtering, over the surface of the polyimide. In one example, the polyimide was back sputtered to prepare the surface, after which 600 Angstroms of 10% titanium +90% tungsten followed by 1000 Angstroms of copper and the titanium-tungsten mixture sputtered simultaneously followed by typically microns of copper were sputtered on. A second layer of photoresist is applied and patterned to define a set of metal leads in the metal layer. The leads reach from the vias penetrating the dielectric to an area in the center of the chip which has a standard pad array of pad contacts that is the same for all the chips that have the same number of leads. For example, a 16 pin chip will have the same standard pad array, of size about 0.016" by 0.016" in a standard configuration having dimensions of 0.126" by 0.126", whether it is a memory or any other logic device. The standard pad array will be sized so that it fits on the smallest chip that is to be used with that leadframe. Optional versions of the invention employ a pad array that is arranged for some particular purpose.

The exposed areas of the metal are plated with a solder composed of a standard mixture of lead and tin in a conventional electrolytic plating process that employs a mixture of 95% tin and 5% lead. The photoresist is stripped and the plated areas of the metal layer are used as an etching mask in the next step in which the remaining unwanted area of the metal layer is etched away in a bath of hydrogen peroxide plus ammonium hydroxide followed by hydrogen peroxide, which does not attack the solder.

Figure 3A:
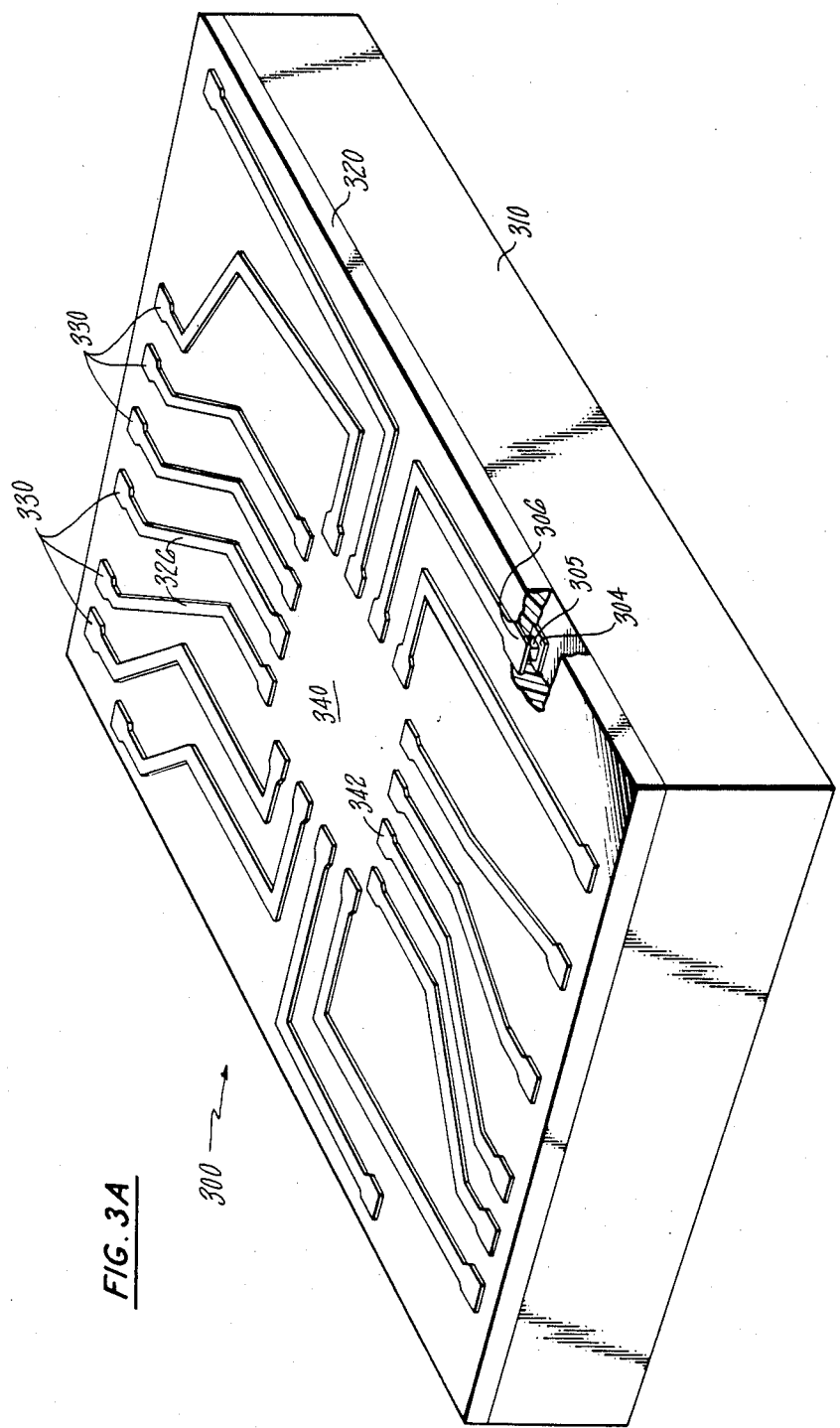
FIGS. 3A and 3B illustrate different forms of a chip used in the subject invention.

There now remains a chip 300 of the form illustrated in FIG. 3A, in which die 310 has on it a thick layer of polyimide 320 and a network of metal lines 326 leading from the contact areas 330 on the outside of the chip to the standard pad array 340. The metal lines 326 have lower inductance greater thermal conductivity and greater strength compared to the wires that were previously used.

In the example shown in FIG. 3A, the first contacts and the vias through the polyimide layer are all formed on the perimeter of the chip. This figure illustrates a chip in which the layout design was made for the old wire-bonding method in which the contact areas had to be on the perimeter of the chip. An advantage of retaining the old design, besides saving the expense of a new layout, is that it is possible to use conventional wire-bonding processes when added capacity is required. To do this however, requires that the additional dielectric and metallizations for the standard pad process is not used.

Figure 3B:
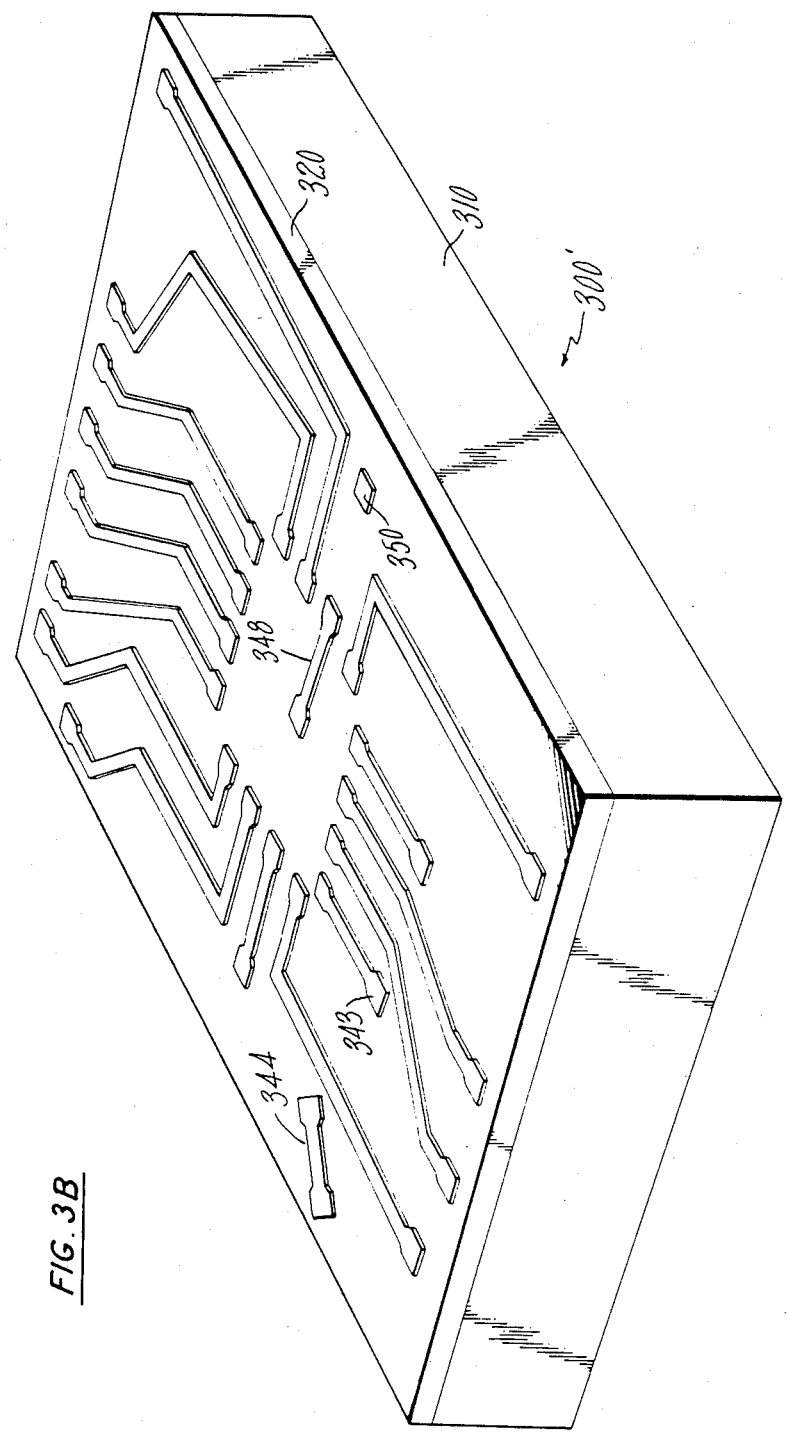

It is also possible to use the invention and put the contact areas through the dielectric at any convenient location, as shown in FIG. 3B. The vias for these leads are shown as originating at different locations on the chip surface, not exclusively at the edge as was the case in the prior art. Lead 348 is shown as connecting a via that is located within the standard pad array. Lead 343 is connected to a via-section 344 through a bridge, not shown in the drawing, that is placed on top of the passivation layer of the underlying chip below the polyimide. This illustrates an additional degree of freedom in routing leads and placing components that is provided by the invention.

A via 305 is shown in FIG. 3A in a cut-away portion of the figure as extending from a lower contact area 304 to an upper contact 306 at an end of one of leads 326. The lower contact pads in current practice are typically 4 mils by 4 mils. With such a large area to make contact, the alignment tolerance for the formation and location of the vias and the placement of leads 326 are typically ±2 mils to 3 mils, which is much greater than a typical tolerance of ±½ mil to 1 mil for connecting leads in the precision processes that are used with conventional wirebonding.

The steps of forming vias and putting down leads may be performed in the front-end using the standard machines for photolithography, if that is convenient. Since the requirements for putting down these metal leads are much less stringent in position alignment than the usual front-end work, it may be preferable to use thick-film technology, such as screen printing, to pattern the dielectric and top leads. Typically, the thick-film technique will be ¼ to ½ the cost of the precision techniques.

Figure 6:
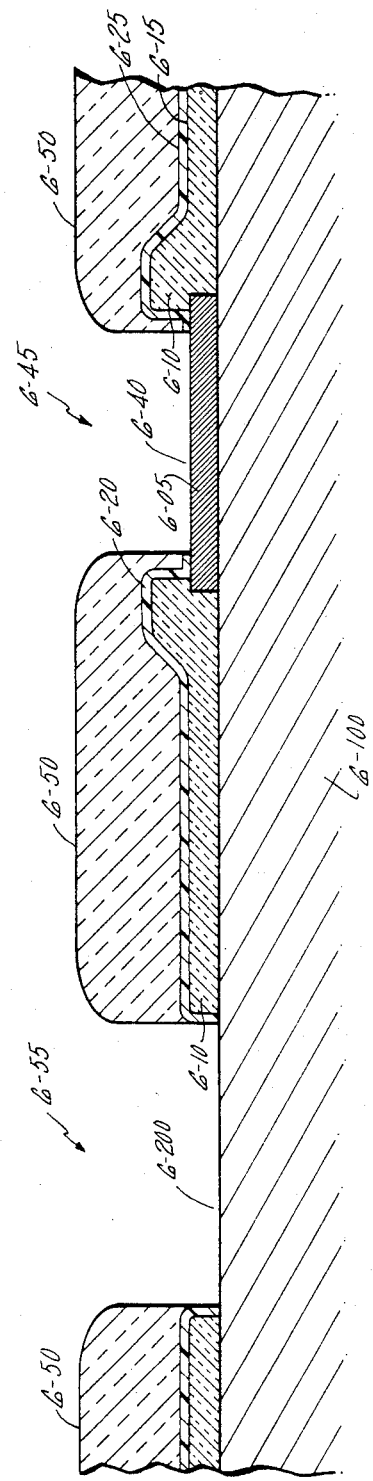
FIG. 6 illustrates a cross section of an integrated circuit suitable for use with the invention.

It has been found that the polyimide layer 320 of FIG. 3 does not adhere reliably if it is attached directly to the layer of oxide immediately below it. A cross section of a portion of a die is shown in FIG. 6, in which substrate 6-100 is the silicon substrate and aperture 6-200 is the "street" that separates adjacent dice. The width of a street is typically 100 microns, to allow room for the saw kerf in the separation step that is performed with a diamond saw having a width of 0.001 inch.

A contact pad, 6-05, is shown with a series of apertures defined above it. Pad 6-05, which is typically aluminum and is connected by metallization strips, not shown, to the rest of the circuit, is surrounded by oxide 6-10, which has a conventional composition of $SiO_2$ plus phosphorous and other additives and a thickness of 1 micron. Oxide 6-10 has a top surface 6-15 on which polyimide layer 6-50 was, at first, applied directly. Early test showed significant difficulty, in that polyimide layer 6-50 (layer 320 in FIG. 3) often disbonded, causing the leadframe to pull the polyimide away from the underlying layer.

Oxide 6-10 functions as the top dielectric layer in the circuit. It not only coats the substrate and contacts, as shown in FIG. 6, but also the circuit elements and metallization.

Passivation of the active elements of the circuit is effected in the usual manner of silicon MOSFETS by the thin oxide over source, drain and active area so that oxide 6-10 functions purely as a dielectric, not as a passivating layer.

Nitride layer 6-20 is deposited by plasma-assisted CVD at a temperature of 250 C, in a conventional manner, to a thickness of 0.3 micron after street 6-200 has been etched through oxide 6-10 to the substrate. A layer of 2525 polyimide from Dupont is applied and spun to produce a relatively flat top surface. Apertures 6-45 above contact 6-05 and 6-55 above street 6-200 are opened through the uncured polyimide by wet etching with a conventional basic solution such as Shipley 312 developer. Typical dimensions for the top of aperture 6-55 and 6-45 are 100 and 87 microns, respectively. After aperture 6-45 has been opened, aperture 6-40 is opened through nitride layer 6-20 by plasma etching in CF4. A typical dimension of aperture 6-40 is 75 microns, so that aperture 6-40 is surrounded by nitride 6-20 and does not expose any of oxide 6-10.

It has been found that the adhesion of polyimide to top surface 6-25 of nitride 6-20 is greatly improved over the adhesion of polymide to oxide 6-10 at surface 6-15. Nitride 6-20 adheres well to oxide at surface 6-15. the function of nitride 6-20 is thus to improve the adhesion of the polymide by means of a structure that totally encloses the oxide 6-10, not only at the vias but also at the saw cuts on the streets.

Probe Test

The next major step II is a test with the individual circuit dice still remaining in the wafer. A conventional wafer electrical test step could be performed in which small probes are attached to the contacts that will be used for the input/output and the individual chips are tested. An advantage of this invention is that the metal leads on top of the polyimide cover a much larger area than the old-style contact pads do, so that it is easier to make electrical contact at reduced pressure of the electrical contact probe or electrode with these large metal pads than it is with the small contact pads used in conventional techniques. It is also possible to make electrical contact to the leads before you reach the contact area, thus providing additional flexibility in the probe step. An important economic benefit from the invention is that only a single set of probe tips will be needed to match the standard pad array for the whole family of circuits that have the same number of pins. In the prior art, a different set of probe tips was typically needed for each chip design.

If the chip has optional electric contact pads outside the standard pad array, as shown by contact 350 in FIG. 3B (which is a via formed to provide access to a point in a circuit that is to be tested, yet does not connect to one of the regular contacts), then a different set of probe pins will be needed in that case, of course.

In conventional wafer tests, defective chips are marked by a small dot of ink so that, in manual assembly, they can be identified and discarded. In this process, the chips are identified electrically—i.e. the wafer is oriented in a particular way and the chips are identified by their locations in an X-Y matrix. The test data for individual chips are stored in the central computer memory or in a floppy disk or other storage medium and defective chips are identified in the computer. This step is referred to in FIG. 2 as wafer mapping.

If the chip has the feature of redundant or optional circuits that are connected or disconnected by blowing fuses by a laser (as is done in large scale memory arrays), then this step will have been done before the polyimide layer is put down, as is currently being done. It is possible, however, to provide for the enabling or disabling of optional subcircuits or the enabling of redundant circuits to be done electrically by means of access through additional contacts (similar to contact 350) that are placed through the polyimide layer outside of the metal strips, or by putting down the polyimide with a large opening over the redundant circuits that will be closed later. In that case, the central computer would identify optional circuits that are to be enabled or disabled and blow fuses appropriately through the test probes. The point in the sequence at which fuse-blowing is to be done is optional, of course.

If the wafers have not been given an identifying label before, it is now necessary to put a label on them in order to maintain the connection between the test data stored in the computer and the wafer the data came from. There are many ways of doing this correlation, of course, and no particular method is required. One preferred method is to put the identification on an identifying label, such as an optical bar code, that identifies the wafer. Another method is to form a programmable memory in the wafer in which the identities of defective chips may be stored. In that case, the wafer carries with it the necessary information so that there is no problem of getting the wafer separated from the test results.

Bond

Figure 7:
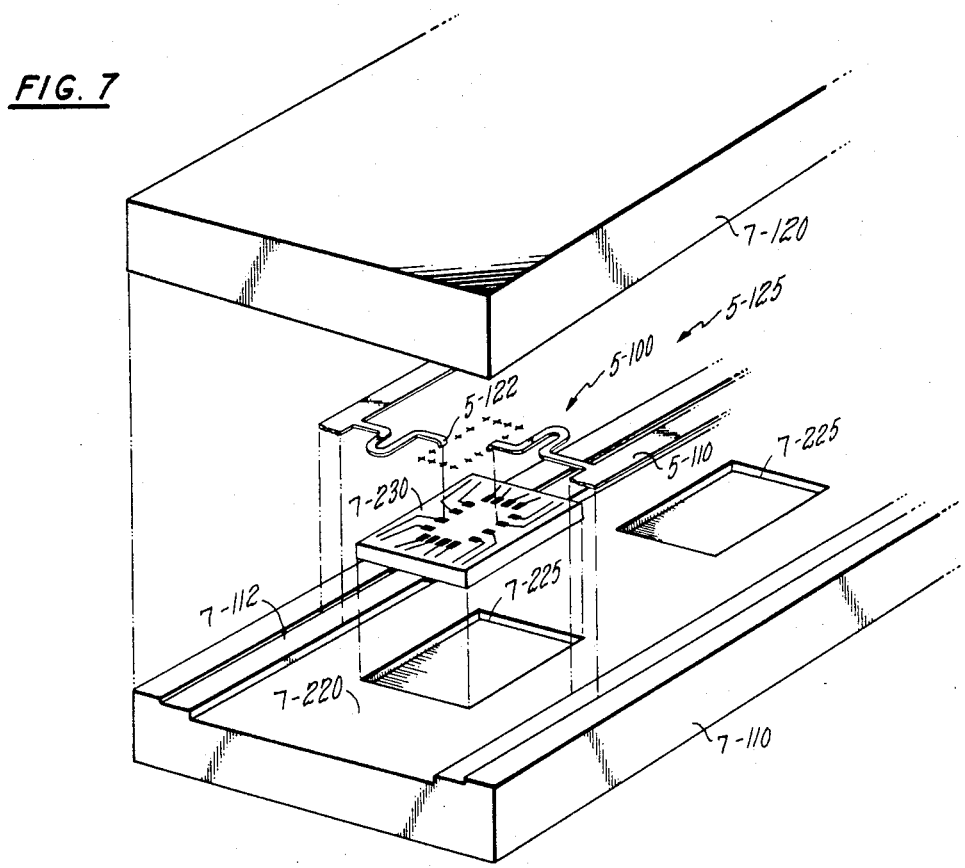
FIG. 7 illustrates a carrier used to hold a leadframe and die during the bonding step.

The assembly for the final bonding step (Step V in FIG. 1 and Leadframe Fixture Assemble, Bond, Disassemble in FIG. 2) is shown in an exploded view in FIG. 7, in which holder 7-110, represented schematically, holds 14 chips with the correct spacing, only two of the receptacles 7-225 being shown. Above receptacle 7-225, there is positioned chip 7-230 and, above the chip, a set of finger contacts 5-122 in leadframe 5-100, part of leadframe strip 5-125. The details of the leadframe will be described below. Cover 7-120 presses down on edge 5-110 of leadframe strip 5-125, which edges rest on shelves 7-112 to position the outer parts of the strip so that the contact tips will be deflected slightly. This deflection is done to compensate for inevitable fluctuations in the position of the tips during the manufacturing process, so that reliable contact is ensured during the bonding operation. The deflection is effected by making the depth of receptacle 7-225 such that the top of chip 7-230 projects above the plane of shelves 7-112 by a set amount. The amount of deflection, (0.005 inch to 0.007 inch) is illustratively several standard deviations of the nominal fluctuation of the tip position to ensure reliable joint formation. The edges 5-110 of leadframe strip 5-125 will be forced on to shelves 7-112 by cover 7-120 and tips 5-122 will thus be pressed against the pads by the spring constant of the leads.

Figure 5:
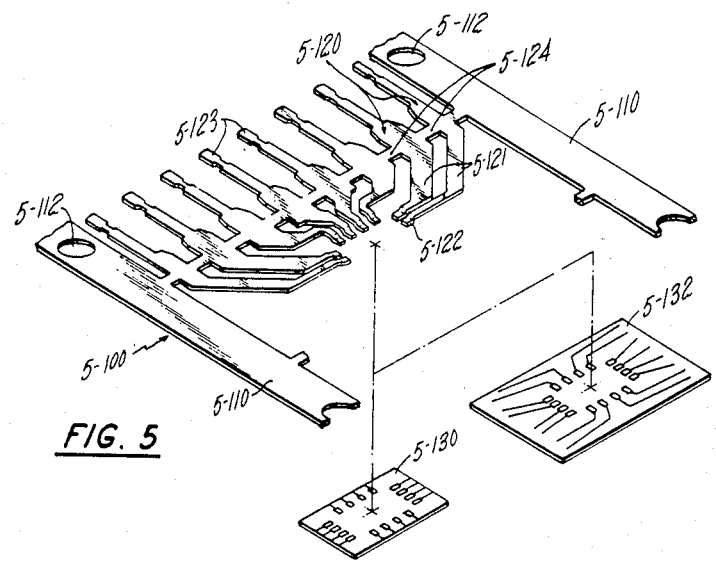
FIG. 5 illustrates a portion of a leadframe.

A simplified drawing of a leadframe constructed according to the invention is illustrated in FIG. 5, in which a portion of a leadframe is shown in an exploded drawing in relation to two differently sized chips. This drawing illustrates an important economic benefit of the invention. Only one leadframe need be kept in inventory for all chips having the same number of pins.

There is another important benefit in that the throughput of the bonding process does not depend on the number of pins, since the leads are attached simultaneously while they are held in position by the lead-supporting components of the leadframe.

The individual leadframes are stamped out of a ribbon of metal that may be an inexpensive copper alloy, in contrast to the expensive alloy having the correct thermal properties that is used in the standard prior art process. Strips 5-110 on either side of the ribbon serve to carry the actual leads 5-120 along. Leads 5-120 have an exterior end 5-123, shaped insertion in a socket or for surface-mounting, and an interior portion 5-121 for attachment to a die. The two portions are joined by positioning members 5-124 that will be severed after the bonding step. Holes 5-112 are provided to give a reference in positioning the leadframe. At the end of each lead segment 5-121, there is a region, 5-122, in which the lead is bent in a quarter circle (or bent twice to form a parallel contact section) to form a standard dimension flat contact area. Each of the different lead segments 5-121, with its different length, has been shaped to provide substantially the same spring constant so that the contact areas 5-122 will be uniformly pressed against the mating pads on the die to give correct alignment for the soldering operation. The leads 5-120 have been tinned with solder in a previous step in the fabrication of the lead frame ribbon.

It is an advantageous feature of the system, but not an essential one, that a family of chips that have the same number of pins have the same standard pad array on top of the dielectric. For illustration, two dice 5-130 and 5-132 of different size are shown together with the leadframe. With this feature, it will then be necessary to have only one ribbon of leadframes for the entire family of chips, with substantial savings in inventory.

Both the contact pads 342 of the die and the tips 5-122 have been tinned and are ready to be heated. The bonding is done by a vapor phase reflow soldering technique or other means of heating the materials to reflow the fusible alloys. These alternative techniques include infra-red heating, conveyor ovens, hot gas heating or laser heating. In vapor phase reflow, a liquid such as Flourinert FC-71 is maintained at its boiling point, the liquid having been selected so that its boiling point is above the soldering temperature. The soldering assembly of holders 7-110 and 7-120, with chips plus leadframe maintained in alignment, is inserted into a container or oven that is filled with the vapor at the boiling-point temperature and held there until the solder has melted and flowed to form a bond. A typical length of time for the heating cycle is 5 to 15 seconds. This boiling point temperature is typically above 225 degrees C. but below 300 degrees C. In contrast, the present wire bonding and die attach steps are performed at temperatures of up to 460 degrees C. and performed individually. In order to reduce the length of the heating cycle, the bonding fixture should have low mass and many apertures to permit the vapor to flow freely about the solder joints. Holders 7-110 and 7-120 have been shown schematically in order to reduce the complexity of the drawing.

An important economic benefit of this invention is that all the leads are soldered at the same time. This is in contrast to the wire-bonding technique, in which the leads must be bonded one by one. The soldering step takes no longer for a 28 pin chip than it does for a 16 pin chip.

Inspect

The next stage (Step VI in FIG. 1) of the assembly sequence is an optional inspection operation in which the mechanical and electrical integrity of the solder bonds is checked. There are many testing mechanisms known in the art, such as pulling on the chip to test the mechanical strength of the joint; placing probes on the edge of the standard pad and the lead frame to test for electrical continuity; or optically examing the lump of solder.

Figure 12:
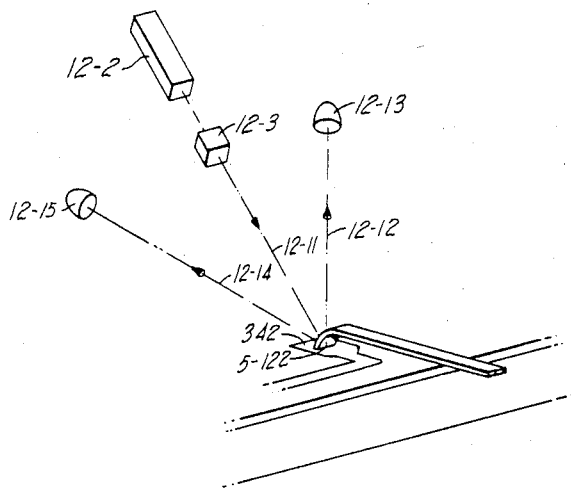
FIG. 12 illustrates a simplified optical inspection device for leadframe to die bonds.

The apparatus illustrated in simplified form in FIG. 12 is an optical test, in which the leadframe strip is taken from holder 7-110 and presented for inspection as an intermediate step in the process of loading a cassette for transport to the molding station. Optical source 12-2, illustratively a semiconductor diode or semiconductor laser, generates a beam 12-11 that passes through power monitoring device 12-3 that measures the input beam power. Beam 12-4 strikes the solder at lead tip 5-122 and reflects in several directions, the exact distribution of reflected power being dependent on the detailed shape of the solder lump and therefore varying from chip to chip. Two detectors 12-13 and 12-15 detect some of the reflected light. Preferably, these detectors have sufficient area to integrate out small fluctuations in the intensity distribution. If lead tip 5-122 did not make contact with the pad, there will be a gap instead of a smooth solder surface and very little light will be reflected. In order to pass the test, both detectors 12-15 and 12-13 must receive a certain fraction of the signal in monitor 12-3. The threshold will be set empirically when the production line is initially put into operation.

All leads on all 14 chips may be tested; only one lead per 14-chip unit may be tested; or anything in between. The number of tests will depend on the usual cost/reliability trade-offs. One suitable method is to move the leadframe strip at a fixed speed past beam 12-11. The signals in detectors 12-15 and 12-13 are sampled when beam 12-11 strikes the point where a bond should be. The individual bonds are thus identified by the time at which they pass through the beam.

Mold

In the next major step, (Step VII in FIG. 1), leadframe 5-100, with 14 chips attached, is placed into a transfer or injection molding machine to mold plastic about it, thus encapsulating and protecting the chip. The molding process will be done using conventional techniques and equipment. It is an advantageous feature of this invention that the wide contact area between the leadframe and the contact pads is extremely rugged compared to the wire bonding technique that is in standard use so that a far smaller fraction of chips will be damaged during handling and the chips can be moved about at a greater rate and with less delicacy required. It is a further advantage that the leads conduct heat away from the chip during operation.

After the encapsulated dice, (still in the leadframe) are removed from the molding machine, the optional labelling step of FIG. 2 is performed. The dice identity first appeared during probe test, when data were measured that applied to an individual die. That identity was preserved by the labels on the wafer, tape frame and leadframe, the computer being updated as required to log the die identity on the leadframe. Each chip may be marked by a laser branding process or any other convenient technique with an identifying label, test results, etc.

The conventional "dejunk" step, in which excess plastic is removed from the leads is also performed at this time.

Trim/Form

Nest, in step VIII of FIG. 1, the chip plus leadframe combination is separated from the ribbon and the spacing segments 5-124 that served to maintain the leads in correct alignment are severed. If the ribbon is formed from a sheet of copper or copper alloy, it is necessary to sever the connections 5-124 or else all the leads will be shorted together. If another version of the ribbon is used, in which a plastic backing is used for the portion 5-110 and to support leads 5-120, on top of which a plated copper lead has been formed, then it will be easy to maintain the sections 5-124 in plastic and it is not necessary to separate the leads.

Leadframe Detail

Figure 8A:
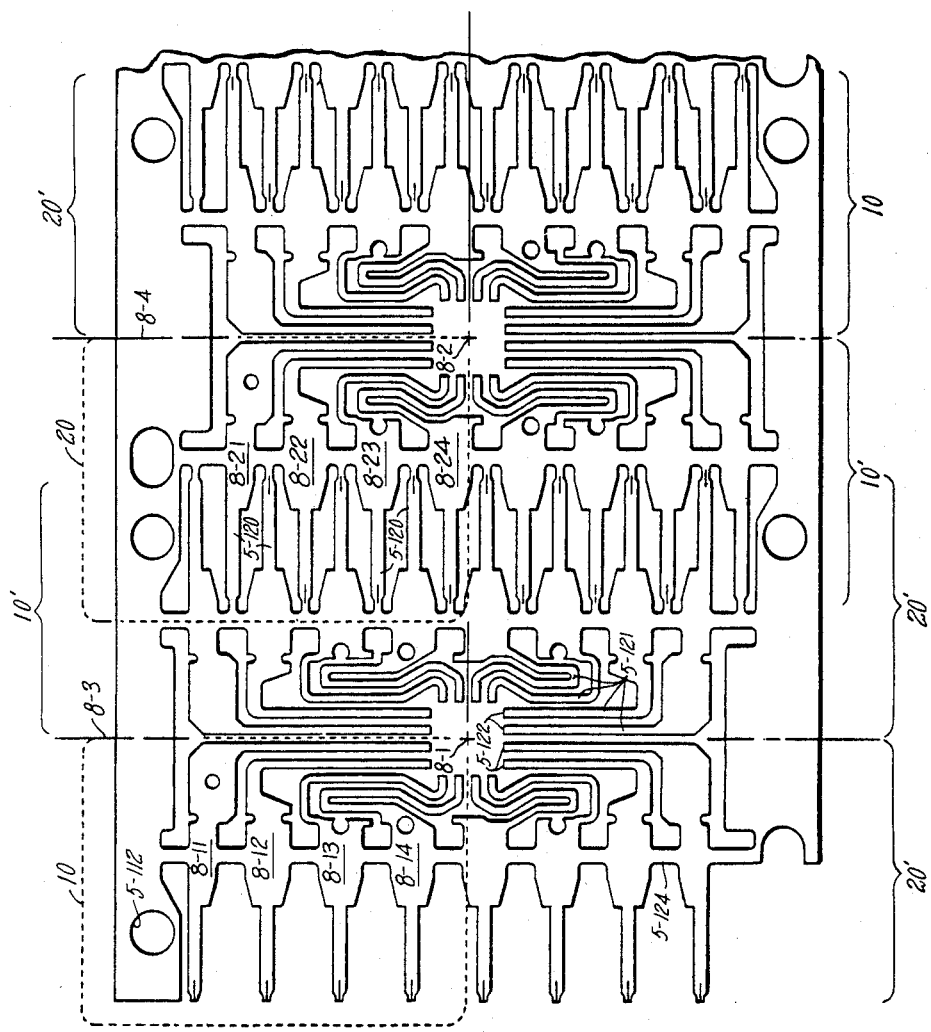
FIGS. 8–8C illustrate a leadframe design suitable for 16-pin integrated circuits.
Figure 8B:
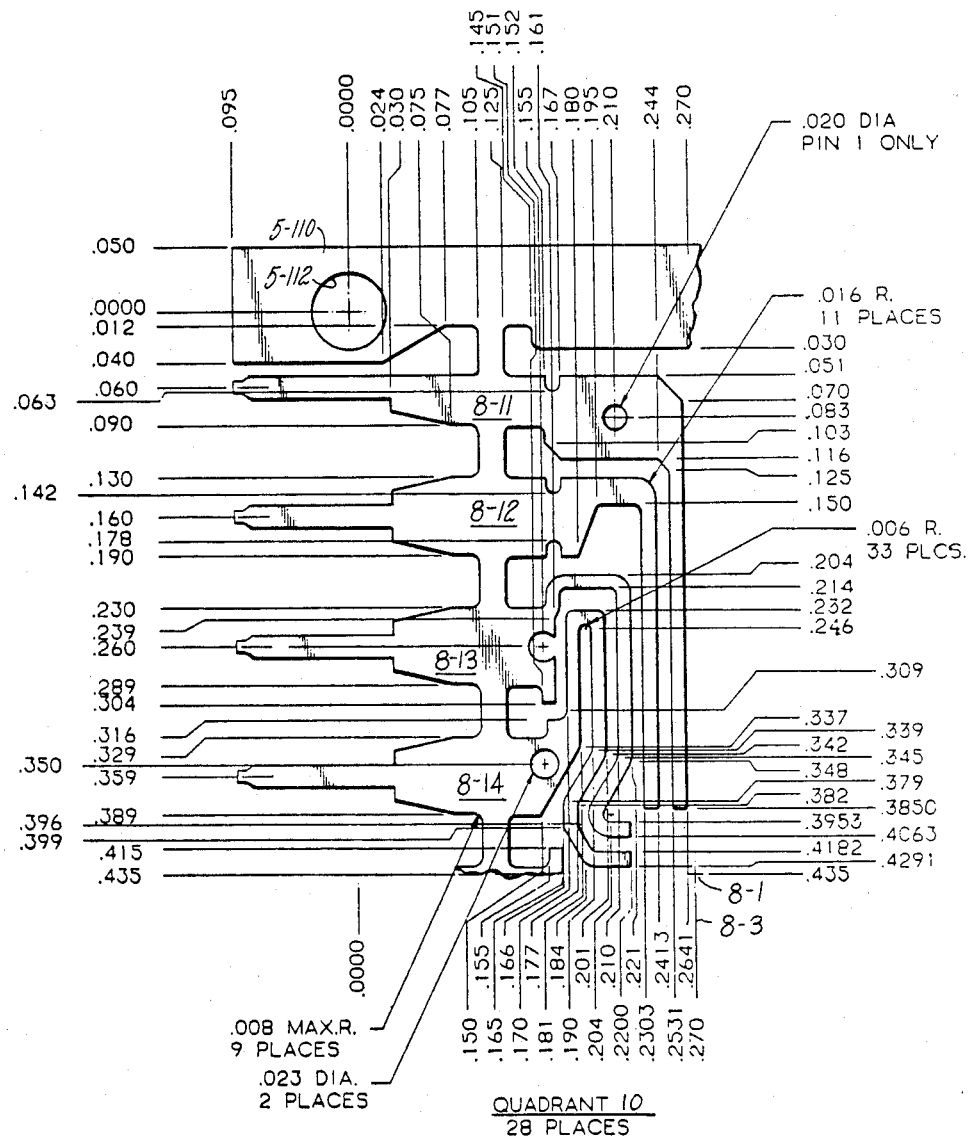
Figure 8C:
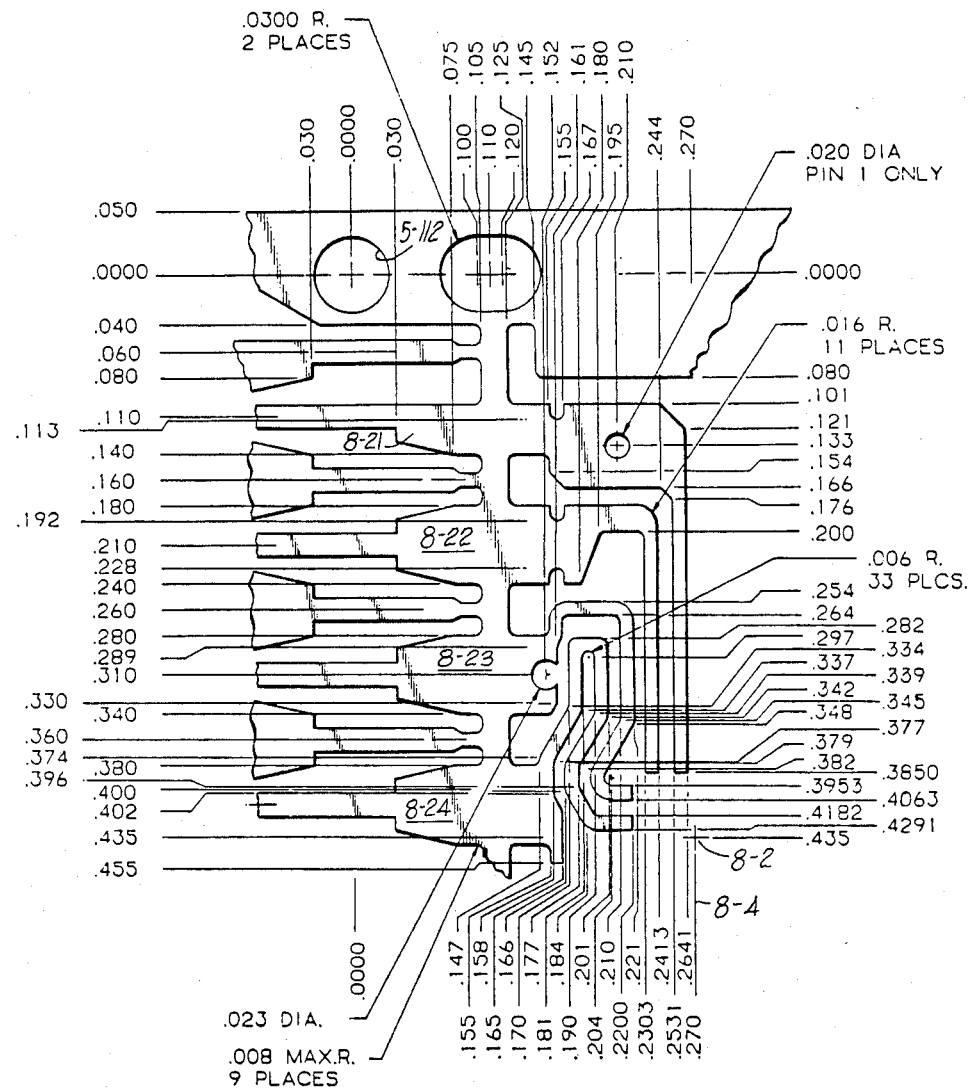

The illustration in FIG. 5 is general in nature, for the purpose of illustrating the broadest version of leadframe to die bonding principles usable in the invention. More leadframe detail is shown in FIG. 8, in which FIG. 8A is a top view of a portion of a leadframe strip containing two leadframes centered on points 1 and 2 respectively.

The figure is crowded because of one advantageous feature of the invention, which is that the exterior portions 5-120 of adjacent leadframes overlap ("interdigitated" in conventional terminology), thus reducing the amount of scrap that is produced when the leads are stamped or etched out of the metal ribbon. It would also be simple to overlap the portions 5-120 by offsetting every other leadframe by one half the distance between leads 5-120, but then the chip location in the fixture would also have to be offset, which would make the die loading into the fixture process more complex.

Each 16-pin leadframe is formed from four quadrants 10, 10', 20 and 20'. Quadrants 10 and 10', are mirror images reflected through centerlines 8-3 or 8-4; as are quadrants 20 and 20'. The difference between quadrants 10 and 20 is the shape of fingers 5-121 that extend from joining strips 5-124 to contact pads 5-122 of the individual leads. Two sets of four leads 8-11 to 8-14 and 8-21 to 8-24 are shown in FIG. 8A and in more detail in FIGS. 8B and 8C, respectively.

In order to show the most complete details of the leadframe, the pertinent portions of working drawings have been reproduced. The numerals with a decimal point are dimensions in inches in a rectangular coordinate system having its origin at the center of hole 5-112. For example, finger 8-11 of quadrant 10 has a width of 0.2641 inch—0.2531 inch or 0.011 inch and is separated from finger 12 by 0.2531 inch—0.2413 inch or 0.012 inch.

Fingers 5-121 have been designed to have the same spring constant; in this embodiment 0.025 mm deflection for 981 dynes, (1 to 2 grams force per 1-mil of deflection) in order to ensure reliable contact between finger tip 5-122 and pad 342. Tips 5-122 are formed by bending fingers 5-121 with a radius of curvature of 0.010 inch, resulting in a contact tip that is nominally 0.01 inch square.

The particular leadframe illustrated has external leads 5-120 conforming to industry standards for a 16-pin D.I.P. The material is OLIN 195, ¾ hard, with thickness 0.010+0.0005 inch before plating. The solder plating is tin-lead 60–350 microinches thick, with a tin content between 88% and 98%, the balance lead.

Centerlines 8-3 and 8-4 of FIG. 8A are separated by 0.540 inches, resulting in a set of 14 leadframes that has an overall length of 7.75 inches.

Many other designs for fingers 5-121 can be made by those skilled in the art in the light of this disclosure. It is not essential for the practice of the invention that fingers 5-121 have exactly the same spring constant and substantial variation is permissible.

Handling the leadframes presents a difficult challenge. They are fragile and would easily be crushed by conventional grippers. Grippers with "tactile" sensors might be used, but they are expensive. Vacuum lifters cannot be used because of the many apertures in the leadframe.

Figure 9A:
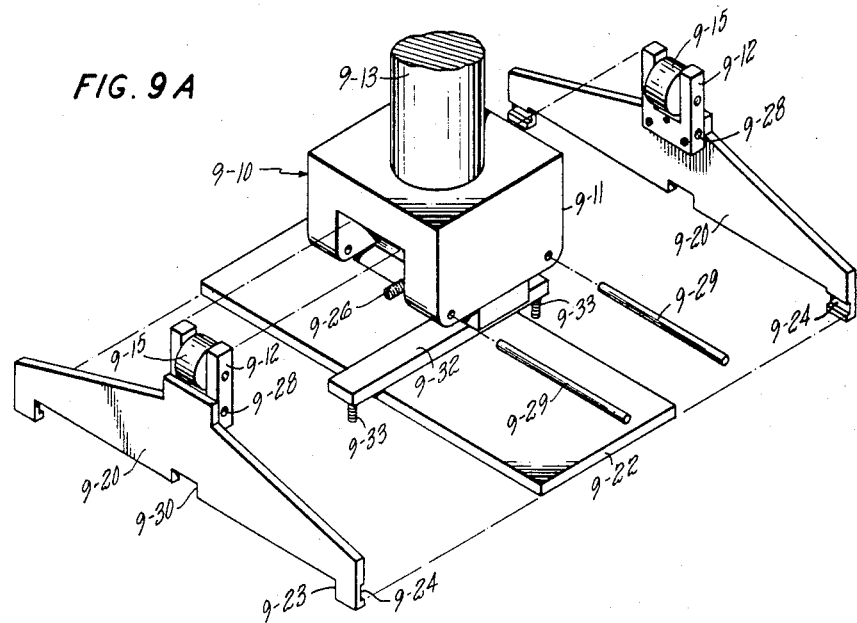
FIGS. 9A and 9B illustrate a gripper mechanism for the leadframes.
Figure 9B:
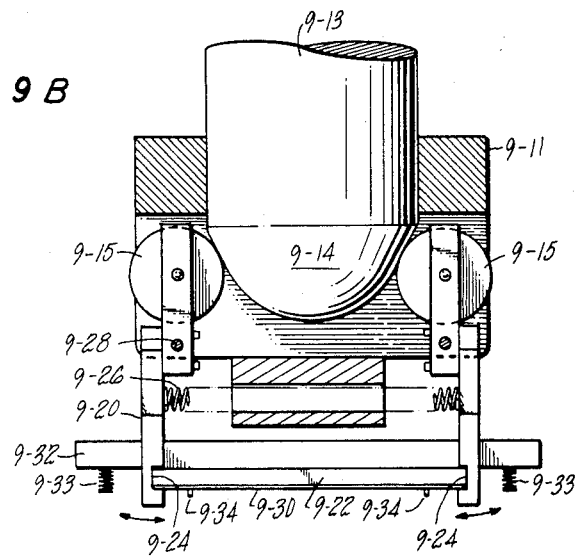

FIGS. 9A and 9B illustrate an economical gripping fixture that handles the task of lifting and aligning the leadframe. FIG. 9A is an exploded view and FIG. 9B is a side view of an assembled fixture. Referring now to FIG. 9B, the principle that has been adopted is the use of a "back-up bar" 9-22 to relieve the pressure that gripping fixtures 9-20 would otherwise exert. The force arises from spring 9-26, shown as connected between grippers 9-20 and pressing them apart. Other springs in different locations or other methods of exerting force may also be used.

Leadframe 9-30 is located below bar 9-22 and between notches 9-24 in extensions 9-23 of gripping fixtures 9-20. As can be seen in FIG. 9A, there are four notches 9-24. There is a nominal clearance of 0.015 inch between the bottom of bar 9-22 and the bottom of notch 9-24. Since leadframe 9-30 is only 0.010 inch thick, there is a margin of 0.005 inch.

Gripping fixtures 9-20 pivot about pivots 9-29 in response to downward pressure from cone 9-14 on rollers 9-15 attached to fixtures 9-20. Cone 9-14 is illustratively part of a commercially available air actuated cylinder with spring return, 9-10, available from the Seiko corporation. Housing 9-11 encloses cylinder 9-13, having cone 9-14 on the lower end, and provides support for pivots 9-29 through hole ends 9-28 on arms 9-12. There are four hole ends 9-28 that support both ends of each pivot 9-29. Housing 9-11 also supports bar 9-22 through a rigid support that is omitted from FIG. 9A for clarity. The motion of gripping fixture 9-20 is indicated by the arrows in FIG. 9B.

Slots 9-30 in fixtures 9-20, visible in FIG. 9A, provide clearance for spring-loaded plungers 9-33, shown schematically in the figures, as being supported by support bar 9-32 fastened to backup bar 9-22. The function of plungers 9-33 is to press against lower bond fixture 7-110 to prevent backup bar 9-22 from being held by its alignment pins to the bonding fixture.

Two alignment pins, 9-34, are shown in FIG. 9B. Pins 9-34 are located on diagonally opposite corners of bar 9-22 in order to locate bonding fixture 7-112 with respect to bar 9-22. This alignment does not align the leadframe with respect to the bonding fixture or with the dice because the holes in the leadframe through which pins 9-34 pass are oversized. That alignment is effected by pins in the bonding fixture, not shown in the drawing, that enter selected holes in the leadframe. The bonding fixture, leadframe and gripper combination must be within a tolerance range before the alignment pins in the bonding fixture will enter the proper holes in the leadframe, of course, and that is the function of pins 9-34. There will always be errors in the exact location of pins and holes and pins 9-34 may bind in their mating holes. Plungers 9-33 are used to ensure disengagement of pins 9-34 from the bonding fixture. Leadframe 9-30 remains with the bonding fixture because the holes in the leadframe through which pins 9-34 pass have a looser tolerance than the four holes that mate with alignment pins in the bonding fixture. The combination of four pins and tighter tolerance ensures that leadframe 9-30 is held fast when the gripper is lifted.

Discrete Component Attachment

Figure 4A:
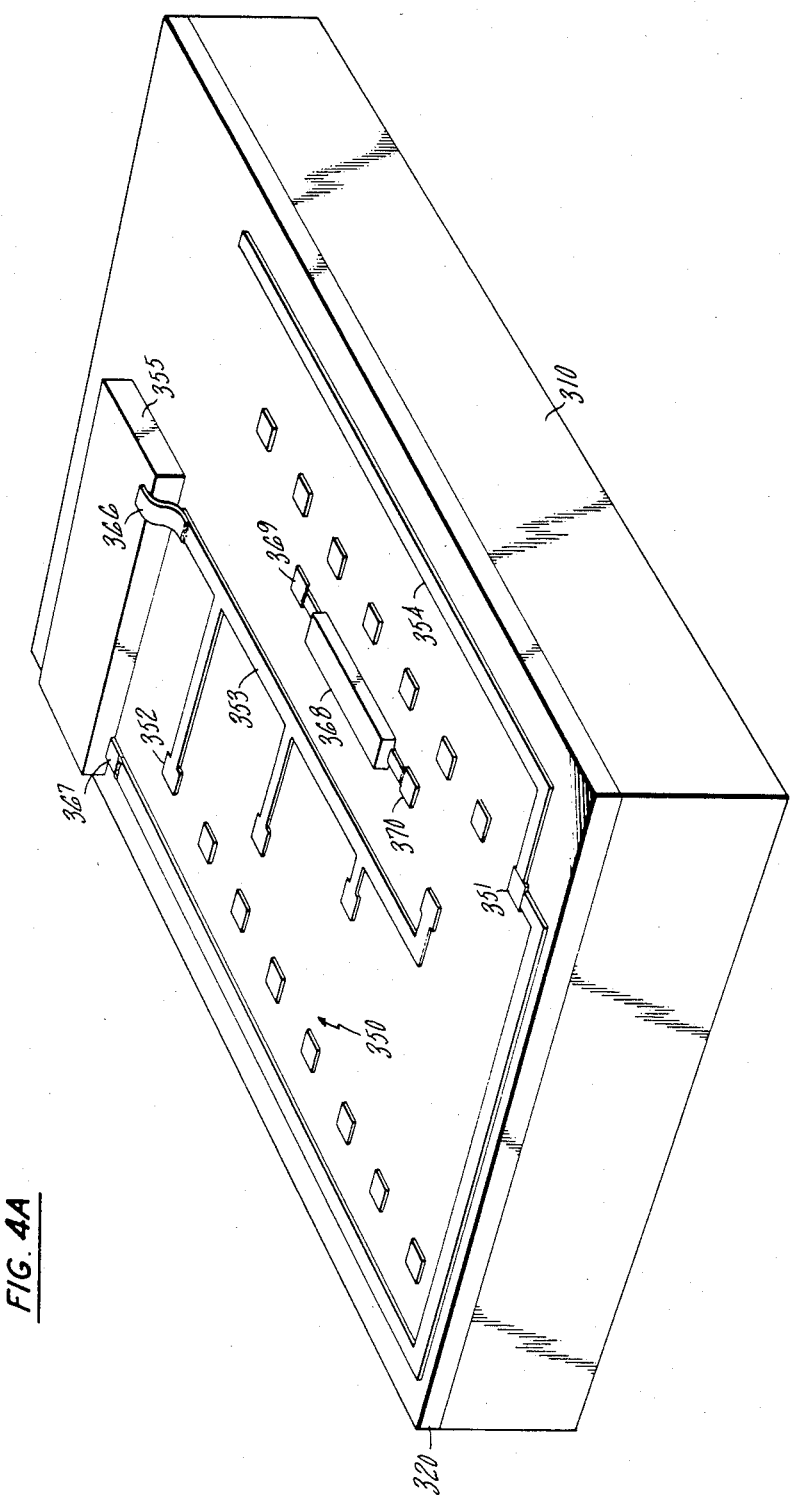
FIGS. 4A and 4B illustrate chips with different arrays of contact pads.
Figure 4B:
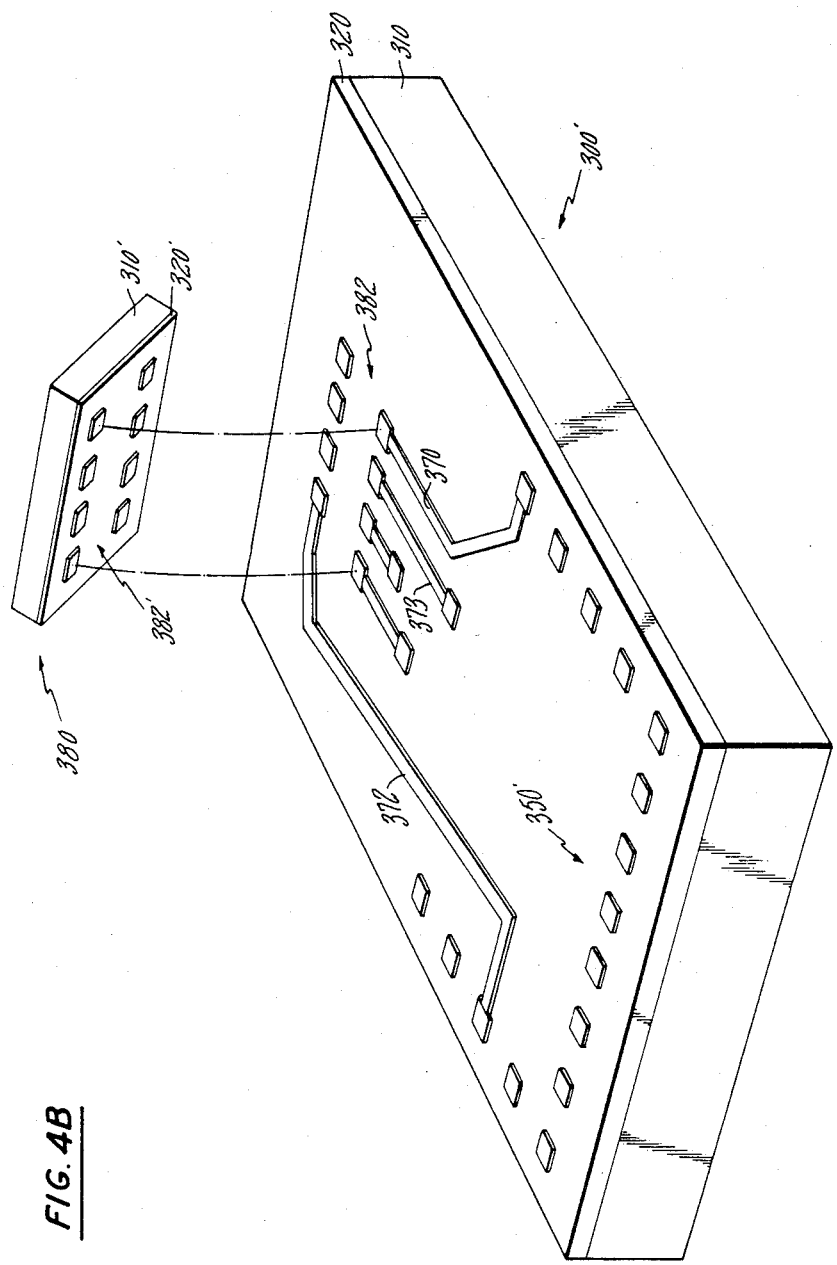

Referring now to FIGS. 4A and 4B, there is shown a variation of a die using the standard pad layout. The standard pad array of FIGS. 3A and 3B used a square outline that was sized to fit on a very small chip, so that a single leadframe could be used for the complete size range. There may be other technical or economic considerations, however, that justify a different pad array (which may still be common to a number of integrated circuits).

For example, FIG. 4A shows a die having the same substrate 310 and polyimide 320 as before, but in which the pad array comprises two rows 350 illustratively of eight pads each, set toward the outside of the chip. With the center clear, there is room for bus 353, which distributes the power supply voltage to various points in the circuit, one of which is a via indicated by the numeral 352 and positioned at one of the array positions to make contact with a lead. Compared with the prior art technique of using thin wires, bus 353 offers considerably less resistance and inductance. Similarly, bus 354 makes contact with pad 351 and distributes the ground terminal about the die.

A further advantage of the sturdy polyimide layer 320 is that discrete electrical devices, active or passive, may be placed on top of layer 320 and connected to the circuit, either by vias or to the standard pads. In FIG. 4A, device 368 is shown as being connected to vias 370 and 369. The device may be a thick-film resistor having a large magnitude (that is difficult to achieve with conventional integrated circuit techniques). It also may be a separately formed device, optionally with conventional surface-mounted-device packaging. Examples are resistors, inductors and capacitors.

One useful example of a capacitor is shown as unit 355, a charge reserve capacitor connected between the power supply and ground using a conductive adhesive at point 367 and to strap 366. Such capacitors are conventionally attached to integrated-circuit sockets to maintain a stable supply voltage when circuits switch. The economic advantages of including the capacitor with the chip are evident. A device such as unit 355 may be connected to any point in the circuit, of course.

One variation that is of great interest is the use of a separate device 355 that is an optical or other element that is difficult to fabricate on the same substrate. For example, device 355 could be a solid-state laser using a gallium arsenide substrate and die 310 could be a conventional silicon integrated circuit. In that case, a fiberoptic pigtail would be included for communication to other optical devices.

Other devices that may be readily implemented are an R-C timing network, either fixed or having an adjustable element for which an access hole is formed in the encapsulating plastic; or a power transistor using the area of device 355 to spread the heat load. Heat sinks may also be attached directly to layer 320 or to vias that provide a low impedance thermal conduction path from high-power sections of substrate 310.

These other devices may be attached in any convenient manner. They may be adhesively attached before or after the soldering of the leadframe (or they may be soldered and the leadframe adhesively attached). Alternatively, soldering or gluing of leadframe and discrete devices may be done simultaneously, with the leadframe maintained in position prior to bonding by an adhesive.

FIG. 4B illustrates another variation of the invention that offers considerable reduction in inventory. There is now a two-chip assembly comprising a first chip 300' having substrate 310, polyimide 320 and surface pads as before, and a second chip 380 comprising substrate 310', polyimide 320' and array of contacts 382' that mate with an array of contacts 382 on layer 320.

An alternate U-shaped contact array 350' is shown, which has the advantage of freeing up half of layer 320 for chip 380. In order to bring all the leads over to one half of chip 300', it may be necessary to permit some variation in the spring constant of the leads.

Only some connections between contacts 350' and 382 are shown, for power supply and ground. Chip 380 may connect directly to the leads for input/output, of course. In the case illustrated, chip 380 is a ROM that needs only power supply and ground and communicates only with the larger chip through vias in array 382 or through surface leads, such as lead 373.

One particular application of great commercial interest is that of a multi-purpose chip, such as a single-chip microcomputer that is customized by adding a ROM. If the ROM is a mask option, then there must be a reserve supply of customized microcomputers to allow for fluctuations in the yield, or rush orders and the manufacturer must maintain an inventory of chips that are good only for one customer. With the embodiment of FIG. 4B, however, the inventory for each customer need only be his ROMs, which are much cheaper than microcomputers. The manufacturer will maintain a reserve of microcomputer chips sufficient to meet the needs of all his customers, of course. It is evident that the total value of inventory will be less with a central reserve, simply because of the laws of statistics.

A variation of the two-chip system is that in which the main chip 300' is a generalized system, such as an input controller and the second chip 380 is one of a number of alternatives, each customized for a particular application. For example, the main chip might be a 5-volt logic chip and chip 380 might be designed to withstand the high voltages of the telephone network in a telephone interface such as a modem or coder.

Many other applications of the second chip, such as interfaces to different manufacturers' computers for plug-compatible systems; or the implementation of one of a number of standard logical functions, such as a parallel output or a serial output, will be evident to those skilled in the art.

One convenient method of attaching chip 380 is to form pads 382' with a sufficient amount of high temperature solder to make reliable contact and to reflow that bond before bonding the leads at a lower temperature. Another method is to adhesively attach chip 380 in alignment and to solder both sets of contacts simultaneously.

Impedance-Matched Leads

Figure 10A:
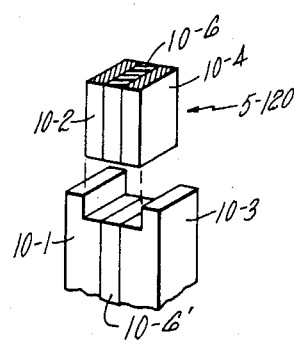
FIGS. 10A and 10B illustrate an alternate leadframe having a specified impedance.
Figure 10B:
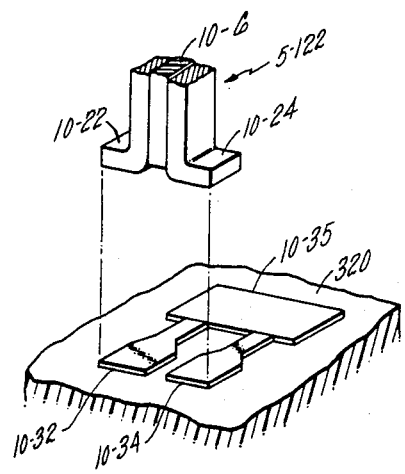
Figure 11:
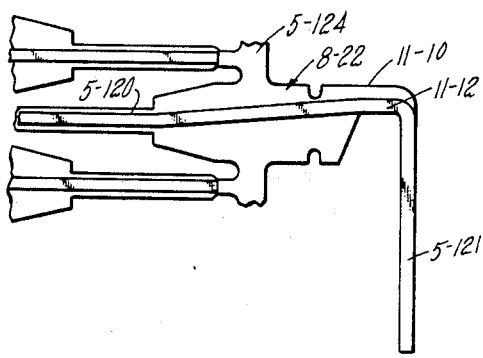
FIG. 11 illustrates a portion of the leadframe of FIG. 10.

An alternate form of leadframe, shown in FIGS. 10 and 11, has the improved feature that the impedance of the leads is a particular value that is matched to the rest of the circuit in which the integrated circuit chip is inserted in order to improve the transmission of signals to and from the chip. The improved leadframe has the same general form as that shown in FIGS. 5 and 8. The major difference in construction is that the material of the leadframe is now a sandwich construction having two layers of conductor with a dielectric inbetween. The thickness of the dielectric and the shape of the leads are chosen to produce the desired impedance.

The reason for using a more complex lead structure is that, in high frequency integrated circuits, the fundamental frequency of a 1 nanosecond pulse is 1 GHz and the bandwidth required to pass such a pulse cleanly is 13 GHz. In this high frequency regime, the packaging of the integrated circuit becomes a limiting factor and the rise time of the lead connecting the integrating circuit with the rest of the system limits the bandwidth of the circuit itself. A further problem of such high frequency systems is that an impedance mismatch between the printed circuit socket or other connector and the lead gives rise to reflections that can cause erroneous results when the circuits respond on a sub-nanosecond time scale.

With the present method of attaching integrated circuits by wire-bonding, a narrow wire having a diameter on the order of 1 mil is used to join the relatively wide leadframe to the integrated circuit chip. Such a narrow diameter wire, of course, has a high inductance associated with it and the impedance mismatch between the wire and the leadframe gives rise to reflections and also to a bandwidth limitation.

Referring now to FIG. 10A, there is shown a portion of a lead indicated generally by the numeral 5-120, referring to the external portion of the lead in FIG. 5. The lead tip is shown comprising a sandwich of a first conductor 10-2, the dielectric 10-6 and the other conductor 10-4. This lead tip is shown above a socket having a first side 10-1 and a second side 10-3 which make electrical contact with the respective conductor layers of the lead tip. One of these electrical conductors will be the ground and the other will carry the signal. The socket is shaped to match the impedance of the lead. Fabrication of this "sandwich" construction is straightforward. Illustratively, the overall leadframe is formed from a sheet of polyimide, laminated between two conductors and the leads are shaped by stamping or etching.

The standard strip transmission line formula is $Z = 120\pi/(\epsilon_r S/W)$; where $\epsilon_r$ is the dielectric constant, S is the separation of the two conductors and W is the width of the lead. Application of this formula to an example in which the width is 10 mils; the thickness of the dielectric is 5 mils; and the material is polyimide, having a dielectric constant of 3.5; the characteristic impedance is calculated to be 50 ohms, which fits well with a commonly used impedance in RF circuits. Those skilled in the art will readily be able to devise different lead constructions for different desired values of impedance.

Referring now to FIG. 10B, the tip 5-122 (the "die tip") of lead 5-121 is shown, in which members 10-22 and 10-24 are the conductors 10-2 and 10-4, bent to provide for easy attachment to contacts on the integrated circuit chip. Suitable contacts, shown as 10-32 and 10-34 are pre-tined contact pads constructed as indicated above in the description of FIG. 3. The transmission line lead 5-122 is terminated by resistor 10-35, which is a discrete resistor formed by thick-film techniques, having the same impedance as the transmission line.

This same attachment technique may be used on the external tips 5-120 of the leadframe if the chip is to be used in a surface mounted device configuration.

Referring now to FIG. 11, a single lead 8-22 from FIG. 8 is shown, having external lead tip 5-120 and lead die tip 5-121. In this case, in order to provide the maximum smoothness in impedance change and the minimum amount of reflections, a single width strip conductor 11-12 having the same width throughout is used. The body 11-10 of this area of lead 8-22 is formed from the dielectric (10-6 in FIG. 10A) and the single narrow strip 11-12 is formed from the conductor. In this way, the reflections and impedance changes that would result from changing the shape of the transmission line are avoided. An additional benefit is that since the segment 5-124 which had to be trimmed away in the embodiment of FIG. 5, is now dielectric, that trimming step may be eliminated, since the leads may remain attached to one another by the plastic with no adverse effect on signal propagation. It is not necessary that a single-width strip be used, and the cross section of the strip may vary, subject to the requirements imposed on the bandwidth of the packaging material by the system application in question.

It is not necessary for the practice of the invention that the contact tips of the leadframe be in a rectangular array. Many other arrangements are possible, such as parallel lines, U-shapes, or any irregular configuration. Similarly, it is not necessary that the exterior portions of the leadframe be configured to the dual in line standard. A single-in-line set of exterior portions may also be used with the invention. A three-or four-sided set of exterior leads could also be used, as could round or any other convenient configuration.

We claim:

1. A leadframe for an integrated circuit comprising: at least one array of electrically conductive leads, each of said leads having an external portion for connection to devices external to said integrated circuit and an attachment portion for providing a connection to a contact on a semiconductor chip; and
    at least two positioning members, each attached to at least one lead of said array of electrically conductive leads between said external portion and said attachment portion, for connecting and positioning said array of electrically conductive leads, whereby said attachment portions of said array of leads are maintained in predetermined positions prior to attachment to a semiconductor chip and said external portions of said array of leads are maintained in a configuration adapted for external attachment; characterized in that:
    said attachment portion of said at least one lead comprises a connector member extending from said positioning member to a contact tip;
    each connector member of said attachment portions extends along a predetermined path such that said contact tip of each of said attachment portions is positioned in a predetermined position in a contact tip array; and
    each of said connector members has a predetermined spring constant which is substantially the same as each other of said connector members characterizing deflection of each of said attachment portions along a line perpendicular to a first plane defined by said at least two positioning members, each of said attachment portions being bent in two steps whereby each contact tip extends out of said first plane and said contact tip array lies in a second plane substantially parallel to said first plane.

2. A leadframe according to claim 1, further characterized in that said at least one array of electrically conductive leads is divided into at least two lead groups, each of which lead groups is positioned and supported by one of said at least two positioning members; and
    in that said contact tip array is disposed between two of said at least two positioning members, a first one of said lead groups being on a first side of said contact tip array, having attachment portions of the leads of said first lead group on an inner side of said positioning member of said first lead group and having the external portions of said leads of said first lead group on an outer side of said positioning member of said first lead group; the other one of said lead groups being on a second side of said contact tip array and having attachment portions of the leads of said other lead group on corresponding inner side of said positioning member of said second lead group and having the external portions of said leads of said other lead group on a corresponding outer side of said positioning member of said other lead group.

3. A leadframe according to either of claims 1 or 2; further characterized in that at least two of said arrays of electrically conductive leads are aligned by at least one connecting strip extending along a strip axis and being severably attached to said at least two arrays of electrically conductive leads so that said contact tip arrays of said at least two arrays of electrically conductive leads are positioned in a predetermined relationship adapted for alignment with at least two pre-positioned integrated circuit pad arrays on at least two integrated circuits, whereby said at least two contact tip arrays may be bonded simultaneously to said at least two integrated circuit pad arrays.

4. A leadframe according to claim 3 further characterized in that;
    all of said at least two contact tip arrays are aligned a first predetermined distance perpendicular to said strip axis and spaced apart by a predetermined separation distance along said strip axis; and
    said external portions of adjacent ones of said at least two arrays of electrically conductive leads are interdigitated by overlapping along said strip axis, with said corresponding external portions of adjacent lead arrays being displaced from said strip axis by alternating first and second displacement distances, whereby the first and second lead groups of one of said arrays of electrically conductive leads are displaced from said strip axis by an amount such that said external portions of said first and second lead groups lie between external portions of adjacent second and first lead groups respectively of adjacent arrays of electrically conductive leads.

5. A leadframe according to claim 4, further caracterized in that;
    the attachment portions of a first array of electrically conductive leads having a first displacement have a first attachment set of predetermined attachment portion lengths such that all of said attachment portions of said first array of electrically conductive leads having a first displacement extend from their respective external portions to respective positions in said contact tip array; and
    the attachment portions of a second array of electrically conductive leads having a second displacement have a second attachment set of predetermined attachment portion lengths such that all of said attachment portions of said second array of electrically conductive leads having a second displacement extend from their respective external portions to corresponding respective positions in said contact tip array.

* * * * *